United States Patent [19]
Lin et al.

[11] Patent Number: 6,083,825
[45] Date of Patent: Jul. 4, 2000

[54] METHOD OF FORMING UNLANDED VIA HOLE

[75] Inventors: Jy-Hwang Lin, Kaohsiung; Yueh-Feng Ho, Hsinchu Hsien; Pei-Jen Wang, Hsinchu, all of Taiwan

[73] Assignee: United Semiconductor Corp., Hsinchu, Taiwan

[21] Appl. No.: 09/329,113

[22] Filed: Jun. 9, 1999

[51] Int. Cl.$^7$ ................................................ H01L 21/4763
[52] U.S. Cl. .................... 438/629; 438/584; 438/618; 438/622; 438/625
[58] Field of Search .................... 438/629, 625, 438/622, 618, 584

[56] References Cited

U.S. PATENT DOCUMENTS 5,880,030  3/1999  Fang et al. .............................. 438/701
5,935,868  8/1999  Fang et al. .............................. 438/692

*Primary Examiner*—Kevin M. Picardat
*Assistant Examiner*—D. M. Collins
*Attorney, Agent, or Firm*—J.C. Patents; Jiawei Huang

[57] ABSTRACT

An improved method of fabricating an unlanded via hole on a semiconductor substrate is provided. A conductive line and a patterned anti-reflection coating layer are sequentially formed on the substrate wherein the patterned anti-reflection coating layer has a smaller width than the conductive line and a portion of the conductive layer is exposed by the patterned anti-reflection coating layer. A planarized dielectric layer is formed over the substrate to cover the patterned anti-reflection coating layer and the conductive line. A via hole is formed in the planarized dielectric layer to expose portions of surface and sidewalls of the patterned anti-reflection coating layer as well as the conductive line.

13 Claims, 3 Drawing Sheets

METHOD OF FORMING UNLANDED VIA HOLE

BACKGROUND OF THE INVENTION

1. Field of Invention

The present invention relates to a method of fabricating a via hole. More particularly, the present invention relates to a method of fabricating an unlanded via hole.

2. Description of Related Art

Due to the increasingly high integration of ICs, chips simply cannot provide sufficient areas for interconnection manufacturing. Therefore, in accord with the increased interconnect manufacturing requirements of miniaturized MOS transistors, it is increasingly necessary for IC manufacturing to adopt a design with more than two metal layers. In particular, a number of function-complicated products, such as microprocessors, even require 4 or 5 metal layers to complete the internal connections. Generally, an inter-metal dielectric (IMD) layer is used to electrically isolate two adjacent metal layers from each other. Moreover, a conductive layer used to electrically connect the two adjacent metal layers is called a via plug in the semiconductor industry.

With the decrease of wire width in ICs and the increase of integration of ICs, misalignment easily occurs as the dielectric layer is patterned to form the via hole. Misalignment causes the dielectric layer to be etched through by etching gas; thus, a landed via hole cannot be formed and the subsequently formed via plug is electrically coupled to the conductive region in the substrate. Therefore device failure results.

FIG. 1 is a schematic, cross-sectional view of an unlanded via hole. A semiconductor substrate 100 is provided. Devices (not shown) are preformed on the substrate 100. A planarization process is performed on the substrate. An aluminum layer is formed on the substrate 100 by sputtering or chemical vapor deposition (CVD). A titanium layer is formed on the aluminum layer by DC magnetron sputtering to serve as a glue layer. A nitridation is performed on the titanium layer to form a titanium nitride layer as a barrier layer. A glue/barrier layer made of titanium/titanium nitride serves as an anti-reflection coating (ARC) layer.

A patterned photoresist layer is formed on the anti-reflection coating layer. Using the patterned photoresist layer as a mask, the ARC layer and the aluminum layer are anisotropically etched to form a patterned ARC layer 108 and a conductive line 102 of aluminum. The patterned ARC layer 108 includes a barrier layer 106 of titanium nitride and a glue layer 104 of titanium. Then the photoresist layer is removed. However, after the anisotropically etching process, the experimental result shows the width of the ARC layer 108 on the conductive layer 102 is somewhat greater than that of the conductive line of aluminum. In other words, the dimension of the ARC layer 108 is bigger than that of the conductive line 102. Consequently, the conductive line 102 of aluminum is completely covered by the ARC layer 108.

A planarized silicon oxide layer 112 is formed over the substrate 100 by chemical-mechanical polishing (CMP) to cover the ARC layer 108 and the conductive line 102. Using the ARC layer 108 as a stop on ARC (SOA), the dielectric layer 112 is defined by photolithography and etching to form a via hole 114 in the dielectric layer 112 to expose a portion of a surface and sidewalls of the ARC layer 108. The width of the ARC layer 108 on the conductive layer 102 is somewhat greater than that of the conductive line so that the ARC layer provides a shield for the conductive line 102.

Hence after the anisotropic etching process is performed with the ARC layer 108 serving as a SOA to form the unlanded via hole, a portion of the dielectric layer 112 is still left between the conductive line and the unlanded via hole 114. Consequently, the unlanded via hole 114 just contacts the ARC layer 108 and cannot make contact with the conductive line 102 of aluminum so as to increase contact resistance generated between the conductive line 102 and a subsequently formed plug in the unlanded via hole 114. Hence RC delay time and device performance are affected.

SUMMARY OF THE INVENTION

Accordingly, the present invention provides an improved method of fabricating an unlanded via hole in a dielectric layer. When the dielectric layer is etched to form the unlanded via hole with an anti-reflection coating (SOA) layer serving as stop on SOA and misalignment occurs, the method can increase contact area between the unlanded via hole and a conductive line. Consequently, RC delay and device performance can be improved.

The invention provides an improved method of fabricating an unlanded via hole on a semiconductor substrate. A conductive layer, an anti-reflection coating (ARC) layer, and a patterned photoresist layer are sequentially formed on the substrate. The anti-reflection coating layer is defined to form a patterned anti-reflection coating layer with a smaller width than the patterned photoresist layer using the patterned photoresist layer as a mask. The conductive layer is defined to form a conductive line with a width approximately equal to that of the patterned photoresist layer using the patterned photoresist layer as a mask wherein a portion of the substrate is exposed by the conductive line. The patterned photoresist layer is removed. A planarized dielectric layer is formed over the substrate to cover the patterned anti-reflection coating layer and the conductive line. A via hole is formed in the planarized dielectric layer to expose portions of surfaces and sidewalls of the patterned anti-reflection coating layer as well as the conductive line.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
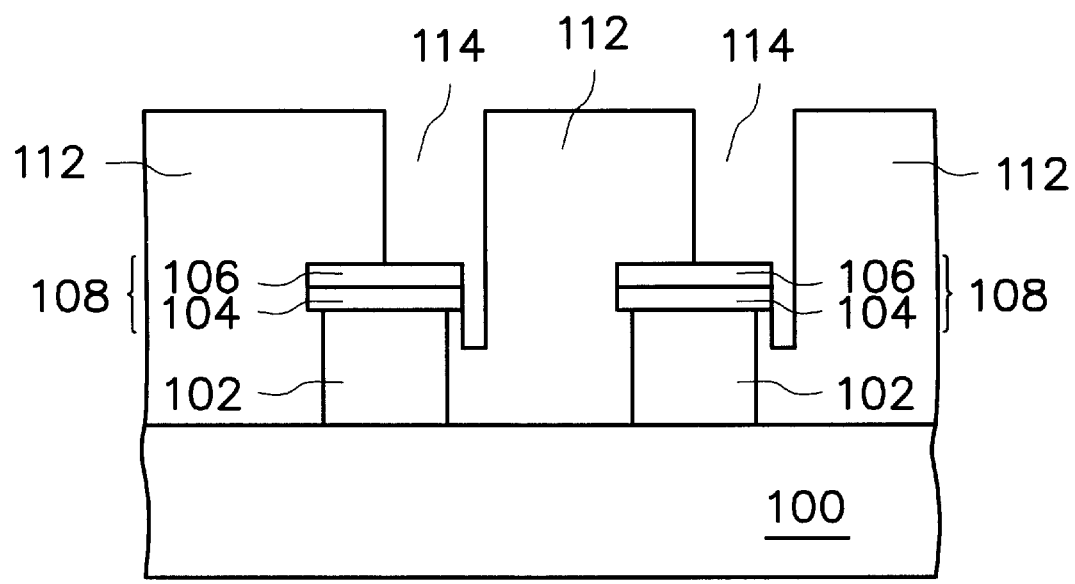
FIG. 1 is a schematic, cross-sectional view of an unlanded via hole.

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2E are schematic, cross-sectional views showing a method of forming an unlanded via hole according to one preferred embodiment of this invention.

Figure 2A:
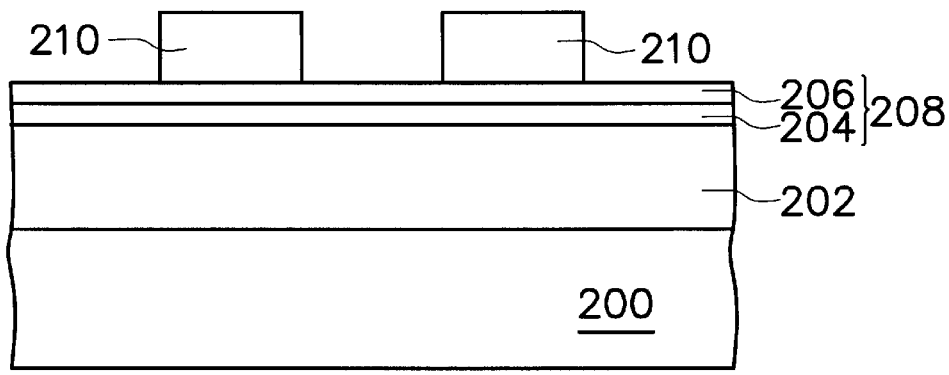
FIGS. 2A through 2E are schematic, cross-sectional views showing a method of forming an unlanded via hole according to one preferred embodiment of this invention.

Referring to FIG. 2A, a semiconductor substrate 200 is provided. Devices (not shown) are preformed on the substrate 200. A planarization process can be performed on the substrate 200. A conductive layer 202 is formed on the substrate 200 to serve as a conductive line in a later process. The conductive layer 202 is formed by, for example, sputtering or chemical vapor deposition (CVD). The conductive layer 202 can be, for example, copper, aluminum, or copper-aluminum alloy layer, and is preferably made of aluminum. A glue layer 204 and a barrier layer 206 are sequentially formed on the conductive layer 202 to serves as an anti-reflection coating (ARC) layer 208. The glue layer 204 includes, for example, titanium or tantalum, and is formed by, for example, DC magnetron sputtering. The barrier layer 206 includes, for example, titanium nitride or tantalum nitride. The method of forming the titanium nitride layer 206 includes reactive ion sputtering, or performing nitridation on the titanium layer 204. A patterned photoresist layer 210 is formed on the ARC layer 208.

Figure 2B:
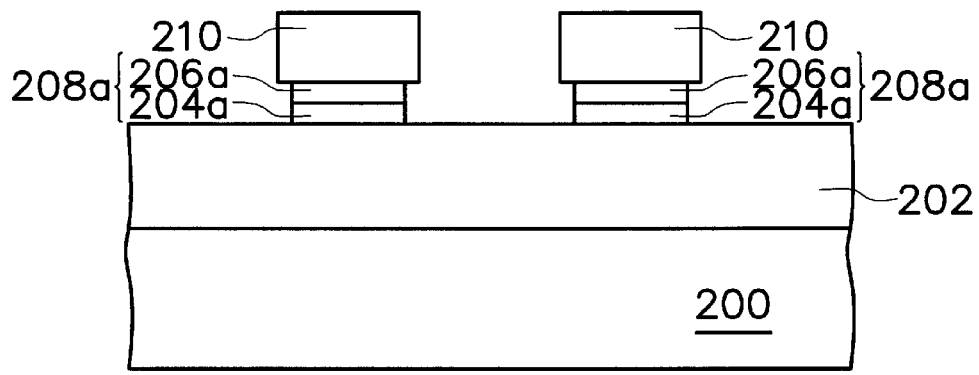

Turning to FIG. 2B, using the photoresist layer 210 as a mask, the ARC layer 208 (FIG. 2A) is etched to form a patterned anti-reflection coating (ARC) layer 208a having a width less than that of the patterned photoresist layer 210. The patterned ARC layer 208a includes a glue layer 204a and a barrier layer 206a. The method for forming the patterned ARC layer 208a includes performing anisotropic etching and then performing isotropic etching on the ARC layer 208 (FIG. 2A). During this step, the conductive layer 202 (FIG. 2A) made of aluminum and the ARC layer 208 (FIG. 2A) made of titanium nitride can use the same etching gas. Hence while etching the ARC layer 208 (FIG. 2A), anisotropic etching is first performed with a composition ratio of the etching gas to etch the ARC layer 202 (FIG. 2A). After the anisotropic etching process is performed and before the conductive layer 202 (FIG. 2A) is etched, the composition ratio of the etching gas is adjusted to continuously perform isotropic etching. For example, a composition ration of chloride ($Cl_2$) is increased and then isotropic etching is performed on the ARC layer 208a. While adjusting the composition ratio of the etching gas, a passivation gas is commonly added for protecting the conductive layer 202.

Figure 2C:
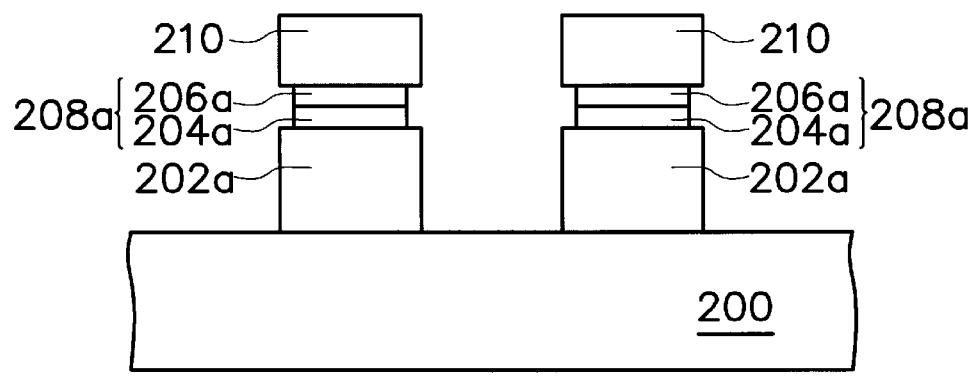

Turning to FIG. 2C, using the photoresist layer 210 as a mask, the conductive layer 202 (FIG. 2B) is etched to form a conductive line 202a. A portion of the substrate 200 is exposed by the conductive line 202a. The width of the conductive line 202a is about equal to that of the patterned photoresist layer 210. In other words, the width of the conductive line 202a is greater than that of the ARC layer 208a, and the ARC layer 208a has a smaller dimension than the conductive line 202a, so only a portion of the conductive line 202a is covered by the ARC layer 208. The conductive line 202a can be formed by anisotropic etching such as reactive ion etching.

Figure 2D:
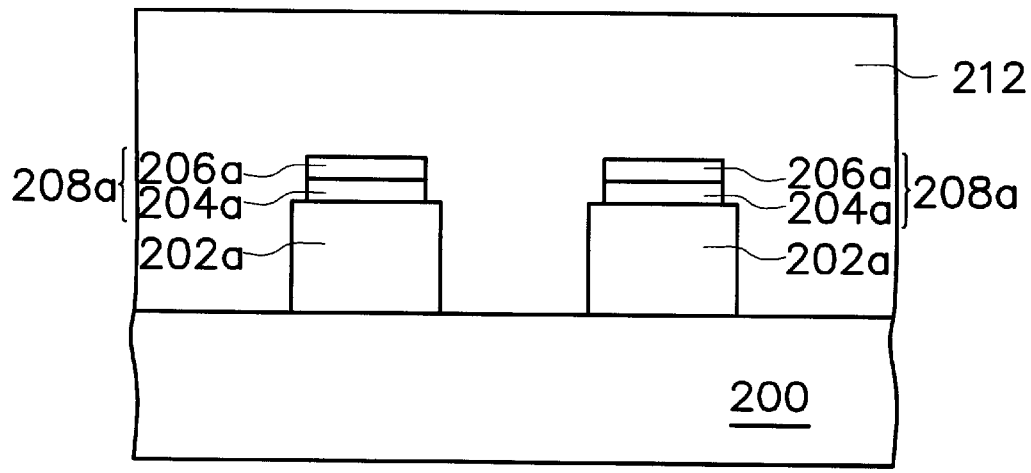

Turning to FIG. 2D, the photoresist layer 210 (FIG. 2C) is removed. A dielectric layer 212 is formed over the substrate 200 to cover the ARC layer 208a and the conductive line 202a. The dielectric layer 212 includes, for example, silicon oxide or borophosphosilicate glass (BPSG), and is formed by, for example, CVD. A planarization process such as chemical-mechanical polishing (CMP) is performed on the dielectric layer 212. Thus the dielectric layer 212 with a plane surface is obtained.

Figure 2E:
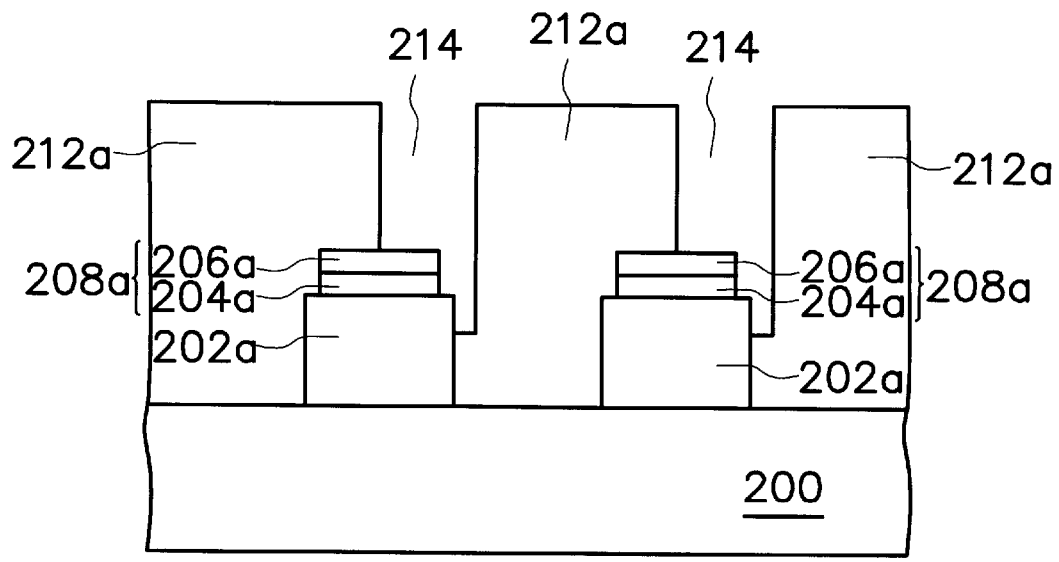

Turning to FIG. 2E, using the ARC layer 208a as a stop on ARC (SOA), the dielectric layer 212 (FIG. 2D) is defined by, for example, photolithography and anisotropic etching to form a via hole 214. The dielectric layer 212 (FIG. 2D) is converted into a dielectric layer 212a. Portions of surfaces and sidewalls of the ARC layer 208a as well as the conductive line 202a are exposed by the via hole 214. Since the ARC layer 208a is used as a SOA, the dielectric layer 212 is not etched through so that the substrate 200 is not exposed.

The dielectric layer 212 (FIG. 2D) and the ARC layer 208a have different etching rates, and the ARC layer 208a has a smaller width than the conductive line 202a so that just a portion of the conductive line 202a is covered by the ARC layer 208a. That is, a portion of the conductive line 202a is exposed by the ARC layer 208a. Therefore, while forming the unlanded via hole, even if misalignment occurs, portions of the surface and sidewalls of the conductive line 202a can be still exposed. Thus, while subsequently forming a plug in the unlanded via hole, the subsequently formed plug has a sufficient good electrical connection with the conductive line 202a. By the different etching rates of the dielectric layer 212 and the ARC layer 208a as well as by using the ARC layer 208a as SOA, while forming the unlanded via hole 214, the dielectric layer 212 can avoid being etched through, which would lead to substrate 200 exposure. Thus, the substrate 200 is protected and device performance is increased. Consequently, unwanted electrical connection generated between the subsequently formed plug and the substrate 200, leading to short and device malfunction, can be avoided.

Accordingly, while defining the conductive line, the characteristic of the invention is to simultaneously form the anti-reflection coating (ARC) layer with a smaller width than the conductive line. In this manner, while forming the unlanded via hole with the ARC layer serving as a SOA, even if misalignment occurs, portions of the surface involving the sidewalls of conductive line can be still exposed. As a result, contact area between the subsequently formed plug and the conductive line is increased and the resistance generated between the plug and the conductive line is also efficiently reduced. Then RC delay and device performance are improved.

Additionally, in the invention, using the different etching rates of the dielectric layer and the ARC layer as well as using the ARC layer as SOA, while forming the unlanded via hole, the dielectric layer can avoid being etched through, which would lead to substrate exposure. Thus, the substrate is protected and device performance is improved. Consequently, unwanted electrical connection generated between the subsequently formed plug and the substrate, leading to shorts and device malfunction, can be avoided.

It will be apparent to those skilled in the art that various modifications and variations can be made to the method and structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating an unlanded via hole on a semiconductor substrate, wherein a conductive layer, an anti-reflection coating (ARC) layer, and a patterned photoresist layer are sequentially formed on the substrate, the method comprising:

defining the anti-reflection coating layer to form a patterned anti-reflection coating layer located at a center position of the conductive layer with a smaller width than that of the patterned photoresist layer using the patterned photoresist layer as a mask;

defining the conductive layer to form a conductive line with a width approximately equal to that of the patterned photoresist layer using the patterned photoresist layer as a mask wherein a portion of the substrate is exposed by the conductive line;

removing the patterned photoresist layer;

forming a planarized dielectric layer over the substrate to cover the patterned anti-reflection coating layer and the conductive line; and forming a via hole in the planarized dielectric layer to expose portions of surfaces and sidewalls of the patterned anti-reflection coating layer as well as the conductive line.

2. The method according to claim 1, wherein the step of forming the patterned anti-reflection coating layer with a smaller width than that of the patterned photoresist layer comprises:

anisotropically etching the anti-reflection coating layer using the patterned photoresist layer as a mask; and isotropically etching the anti-reflection coating layer to form the patterned anti-reflection coating layer with a smaller width than that of the patterned photoresist layer using the patterned photoresist layer as a mask to expose the conductive layer.

3. The method according to claim 1, wherein the conductive line is formed by anisotropic etching.

4. The method according to claim 1, wherein the planarized dielectric layer is formed by chemical-mechanical polishing.

5. The method according to claim 1, wherein the via hole is formed by anisotropic etching.

6. The method according to claim 1, wherein the step of forming the via hole comprises anisotropically etching the planarized dielectric layer using the anti-reflection coating (SOA) layer as a stop on ARC (SOA).

7. A method of fabricating an unlanded via hole on a semiconductor substrate, comprising:

sequentially forming a conductive line and a patterned anti-reflection coating layer on the substrate wherein the patterned anti-reflection coating layer is located at a center position of the conductive layer and has a smaller width than the conductive line and a portion of the conductive line is exposed by the patterned anti-reflection coating layer;

forming a planarized dielectric layer over the substrate to cover the patterned anti-reflection coating layer and the conductive line; and forming a via hole in the planarized dielectric layer to expose portions of surface and sidewalls of the patterned anti-reflection coating layer as well as the conductive line.

8. The method according to claim 7, wherein the step of forming the conductive line and the patterned anti-reflection coating layer further comprises:

sequentially forming a conductive layer and an anti-reflection coating layer on the substrate; and defining the anti-reflection coating layer and the conductive layer to form the patterned anti-reflection coating layer and the conductive line.

9. The method according to claim 8, wherein the step of forming the patterned anti-reflection coating layer comprises:

anisotropically etching the anti-reflection coating layer to remove a portion of the anti-reflection coating layer; and isotropically etching the anti-reflection coating layer to remove a portion of the anti-reflection coating layer until a portion of the conductive layer is exposed.

10. The method according to claim 8, wherein the conductive line is formed by anisotropic etching.

11. The method according to claim 7, wherein the planarized dielectric layer is formed by chemical-mechanical polishing.

12. The method according to claim 7, wherein the via hole is formed by anisotropic etching.

13. The method according to claim 7, wherein the step of forming the via hole comprises anisotropically etching the planarized dielectric layer using the anti-reflection coating (ARC) layer as a stop on ARC (SOA).

* * * * *